(12) United States Patent
Pantazi et al.

(10) Patent No.: US 9,964,419 B2
(45) Date of Patent: May 8, 2018

(54) SENSOR ARRANGEMENT FOR POSITION SENSING (71) Applicant: INTERNATIONAL BUSINESS MACHINES CORPORATION, Armonk, NY (US)

(72) Inventors: Angeliki Pantazi, Rueschlikon (CH); Abu Sebastian, Rueschlikon (CH); Tomas Tuma, Rueschlikon (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 6 days.

(21) Appl. No.: 15/407,353

(22) Filed: Jan. 17, 2017

(65) Prior Publication Data

US 2017/0122780 A1    May 4, 2017

Related U.S. Application Data

(63) Continuation of application No. 14/918,873, filed on Oct. 21, 2015, now Pat. No. 9,575,142.

(30) Foreign Application Priority Data

Nov. 28, 2014    (GB) .................................. 1421183.3

(51) Int. Cl.
  *G11B 5/39*    (2006.01)
  *G01D 5/16*    (2006.01)
  *G01R 33/09*    (2006.01)
(52) U.S. Cl.
  CPC ............. *G01D 5/16* (2013.01); *G01R 33/091* (2013.01); *G11B 5/3903* (2013.01)

(58) Field of Classification Search
  CPC ....... G11B 5/39; G11B 5/3932; G11B 5/3903; G01D 5/16
  (Continued)

(56) References Cited

U.S. PATENT DOCUMENTS 4,471,304 A * 9/1984 Wolf ................... F15B 15/2846
                                                  324/207.24
6,130,791 A * 10/2000 Muto ..................... G11B 5/012
                                                  360/46

(Continued)

OTHER PUBLICATIONS

Angeliki Pantazi, et al., Pending U.S. Appl. No. 14/918,873 entitled "Sensor Arrangement for Position Sensing," filed with the U.S. Patent and Trademark Office on Oct. 21, 2015.

(Continued)

*Primary Examiner* — Jefferson Evans
(74) *Attorney, Agent, or Firm* — Cantor Colburn LLP (57) ABSTRACT

A sensor arrangement for position sensing comprises a magnetic field source and a magnetoresistive element arranged in a magnetic field generated by the magnetic field source, which magnetoresistive element provides an output signal (R) dependent on a position (x) of the magnetoresistive element relative to the magnetic field source. A feedback controller is configured to receive the output signal (R) of the magnetoresistive element and is configured to adjust one or more of the position (x) of the magnetoresistive element relative to the magnetic field source and a strength of the magnetic field generated by the magnetic field source acting on the magnetoresistive element dependent on the output signal (R) of the magnetoresistive element.

11 Claims, 7 Drawing Sheets

(58) Field of Classification Search
USPC .................................... 360/313; 324/207.11
See application file for complete search history.

(56) References Cited

U.S. PATENT DOCUMENTS

| | | | | |
|---|---|---|---|---|
| 6,307,719 B1* | 10/2001 | Mallary | ............... | G11B 5/4826 360/244.8 |
| 6,373,676 B1* | 4/2002 | Baker | .................... | H02N 15/00 361/143 |
| 7,812,596 B2* | 10/2010 | Potter | .................... | G06F 3/016 324/207.21 |
| 8,553,507 B1* | 10/2013 | Tagawa | ................. | G11B 5/314 369/13.13 |
| 2004/0046549 A1* | 3/2004 | Van Ostrand | .......... | G01D 5/147 324/207.21 |
| 2006/0294507 A1* | 12/2006 | Buskens | ............. | G06F 11/1417 717/133 |
| 2007/0088630 A1* | 4/2007 | MacLeod | ............ | G06Q 10/087 705/28 |
| 2008/0084628 A1* | 4/2008 | Ohta | .................... | G11B 5/3136 360/59 |
| 2008/0244588 A1* | 10/2008 | Leiserson | ............. | G06F 9/4881 718/102 |
| 2009/0102465 A1* | 4/2009 | Jansen | ................... | B82Y 25/00 324/207.21 |
| 2009/0184706 A1* | 7/2009 | Duric | .................... | B82Y 25/00 324/202 |
| 2010/0085041 A1* | 4/2010 | Pozidis | ................. | B82Y 15/00 324/207.21 |
| 2011/0032758 A1* | 2/2011 | Son | .................... | G11C 11/5642 365/185.03 |
| 2012/0317460 A1* | 12/2012 | Chilappagari | ...... | G06F 11/1048 714/773 |
| 2013/0082697 A1* | 4/2013 | Fu | ........................ | G01R 33/096 324/252 |
| 2014/0040704 A1* | 2/2014 | Wu | ........................ | G11C 29/52 714/773 |
| 2014/0047445 A1* | 2/2014 | Roy | ........................ | G06F 9/46 718/100 |
| 2014/0081893 A1* | 3/2014 | Modha | .................... | G06N 3/08 706/25 |
| 2014/0114893 A1* | 4/2014 | Arthur | .................... | G11C 11/54 706/25 |
| 2015/0046117 A1* | 2/2015 | Schaaf | ............... | G01D 5/24495 702/151 |
| 2015/0300840 A1* | 10/2015 | Haeberle | ................ | G01D 5/145 324/207.21 |
| 2015/0317201 A1* | 11/2015 | Best | .................... | G06F 11/2053 714/6.11 |
| 2016/0153808 A1* | 6/2016 | Pantazi | .................. | G01D 5/145 324/207.21 |
| 2016/0238672 A1* | 8/2016 | Schaaf | .................... | G01D 5/145 |
| 2016/0265939 A1* | 9/2016 | Haeberle | ................ | G01R 33/09 |
| 2016/0265991 A1* | 9/2016 | Dixon | .................... | G01L 13/04 |

OTHER PUBLICATIONS

Angeliki Pantazi, et al., Pending U.S. Appl. No. 14/967,631 entitled "Sensor Arrangement for Position Sensing," filed with the U.S. Patent and Trademark Office on Dec. 14, 2015.

List of IBM Patents or Patent Applications Treated As Related; (Appendix P), Filed Jan. 17, 2017, 2 pages.

* cited by examiner

SENSOR ARRANGEMENT FOR POSITION SENSING

PRIORITY

This application is a Continuation of U.S. application Ser. No. 14/918,873 filed Oct. 21, 2015; which claims priority to GB Patent Application No. 1421183.3; filed Nov. 28, 2014 and all the benefits accruing therefrom under 35 U.S.C. § 119, the contents of which in its entirety are herein incorporated by reference.

BACKGROUND

The present invention relates to a sensor arrangement for position sensing and to a method for supporting determining the position of an object.

High bandwidth, high resolution nanoscale sensing is a key enabling technology for nanoscale science and engineering. Application areas include life sciences, scanning probe microscopy, semiconductor fabrication and material science. Currently available position sensors based on optics, capacitors or inductive coils, although accurate and fast, do not scale down to micro-scales for use in micro-structures or in large-scale point-wise position sensing of macro-structures. Thermo-electric position sensors, on the other hand, scale down to micro-scale, but suffer from low resolution and bandwidth.

A known position sensing concept is based on the property of magnetoresistance (MR). Magnetoresistance is the property an electrical resistance of a conductive layer sandwiched between ferromagnetic layers changes as a function of a magnetic field applied to the layers. A magnetoresistive sensor typically uses this property to sense the magnetic field.

BRIEF SUMMARY

According to an embodiment of one aspect of the invention, a sensor arrangement is provided for position sensing. The sensor arrangement comprises a magnetic field source and a magnetoresistive element arranged in a magnetic field generated by the magnetic field source. The magnetoresistive element provides an output signal dependent on a position of the magnetoresistive element relative to the magnetic field source. A feedback controller is provided and configured to receive the output signal of the magnetoresistive element and to adjust one or more of the position of the magnetoresistive element relative to the magnetic field source and a strength of the magnetic field generated by the magnetic field source and acting on the magnetoresistive element dependent on the output signal of the magnetoresistive element.

According to another embodiment, a method for supporting determining the position of an object is provided. The method includes coupling one of a magnetic field source and a magnetoresistive element with the object and arranging the magnetoresistive element in a magnetic field generated by the magnetic field source. The method also includes receiving an output signal (R) from the magnetoresistive element dependent on its position (x) relative to the magnetic field source and adjusting one or more of the position (x) of the magnetoresistive element relative to the magnetic field source and a strength of the magnetic field generated by the magnetic field source acting on the magnetoresistive element dependent on the output signal (R) of the magnetoresistive element.

BRIEF DESCRIPTION OF THE DRAWINGS

The invention and its embodiments will be more fully appreciated by reference to the following detailed description of exemplary embodiments in accordance with the present invention when taken in conjunction with the accompanying drawings. The figures are illustrating.

DETAILED DESCRIPTION

As an introduction to the following description, it is first pointed at a general aspect of the invention concerning a sensor arrangement based on the magnetoresistive effect.

A magnetoresistive sensor preferably comprises a magnetoresistive element comprising a stack of layers which stack of layers includes at least a conductive layer in between two magnetic layers, and preferably in between two ferromagnetic layers. Specifically, the magnetoresistive element is a giant magnetoresistive element based on the underlying effect wherein in a layer stack comprising a non-magnetic conductive layer sandwiched between two ferromagnetic layers a change in the electrical resistance can be observed subject to a magnetization orientation in the ferromagnetic layers. In the absence of an external magnetic field, the magnetization orientation of the corresponding ferromagnetic layers is antiparallel. By means of applying an external magnetic field to at least one of the ferromagnetic layers the subject magnetization orientation is changed which in turn leads to the magnetization orientation in the two ferromagnetic layers becomes parallel which in turn causes the electrical resistance of the layer stack to change. The electrical resistance of the layer stack is also denoted as electrical resistance of the magnetoresistive element. The change in the electrical resistance may be monitored and taken as a measure for the presence of an external magnetic field applied. When such external magnetic field is generated by a magnetic field source attached to an object, a position of such object may be determined with respect to the magnetoresistive element. Specifically, a significant change of the electrical resistance in the conductive layer can be observed when the magnetization orientation of the ferromagnetic layers is changed between a parallel alignment to an antiparallel alignment or vice versa. In a parallel alignment of the magnetization orientation of the ferromagnetic layers the electrical resistance in the conductive layer is rather low while in an antiparallel alignment of the magnetization orientation of the ferromagnetic layers the electrical resistance in the conductive layer is rather high. The change in conductivity is based on spin-dependent interfacial electron scattering. Electrons passing the magnetoresistive element may show a short mean free path at antiparallel magnetization orientation in the ferromagnetic layers owed to an increased spin dependent electron scattering at the interfaces between the conductive layer and the ferromagnetic layers while electrons may show a longer mean free main path owed to a less spin dependent interfacial electron scattering when the ferromagnetic layers show a parallel magnetization orientation.

The magnetoresistive element hence preferably comprises a stack of layers which at least includes one conductive layer in between two ferromagnetic layers, but which stack of layers may include multiple conductive layers sandwiched between adjacent ferromagnetic layers, wherein an overall electrical resistance of the stack of layers may finally be measured and allow for a determination of the position of the field generating magnet relative to the magnetoresistive element. An external magnetic field applied may cause the magnetization orientation in these ferromagnetic layers to switch from an antiparallel alignment to a parallel alignment or vice versa. Generally, and specifically for the present embodiments of the invention, the magnetization orientation of both ferromagnetic layers may be floating or, alternatively, the magnetization orientation of one of the ferromagnetic layers may be pinned such that its magnetization orientation may not change even under the application of an external magnetic field. The external magnetic field may then only act on the other ferromagnetic layer and cause its magnetization orientation to change subject to a position the magnet takes.

In the context of the present embodiments of the invention, the following geometrical definitions are used: The layers of the layer stack may have a longitudinal extension along a longitudinal axis and a lateral extension along a transverse axis. Accordingly, a height of the stack extends orthogonal to a plane defined by the longitudinal and the transverse axis along a vertical axis. A sensor central axis of the magnetoresistive element is defined as an axis along the vertical axis, and at half of the longitudinal extension of the layers. It is preferably assumed that a magnetic field source and/or an object comprising the magnetic field source is at least movable along the longitudinal axis, which means that the magnetic field source is movable along the longitudinal extension of the layers of the layer stack. Preferably, the magnetic field source is arranged at a vertical distance D>0 from the magnetoresistive element such that the magnet field source and an upper surface of the magnetoresistive element are spaced apart along the vertical axis by the distance D. Moreover, the magnetic field source provides a magnetic field approximating a magnetic dipole including a North (N) and a South (S) pole. A dipole axis of the magnetic dipole is assumed to be a straight connection between the N pole and the S pole.

In conventional magnetoresistive position sensing concepts a dipole axis of the magnetic dipole of the magnet is aligned in parallel to a longitudinal extension of the layers of the layer stack contributing to the magnetoresistive element. Given that a gradient of the magnetic field is responsible for generating a change in the magnetization orientation of the one or more ferromagnetic layers, it was observed that in the conventional concept the gradient of the magnetic field along the longitudinal extension of the layers of the stack is rather low. The gradient is defined as a change in magnetic flux for a small variation in the location x. However, the higher the gradient of the magnetic field is along the longitudinal extension of the layers of the stack the higher the sensitivity/resolution of the sensing scheme is given that only a small variation of the position of the magnet may cause an impact on the magnetization orientation of the ferromagnetic layers because such small variation in position still leads to a substantial change in magnetic flux owed to the high gradient. In addition, it was observed that for typical magnet geometries such as rectangular permanent magnets, an absolute strength of the magnetic field at a given distance from the magnet increases with the gradient. Because there is an upper bound on the strength of the magnetic field after which the magnetoresistive element saturates, the gradient of the magnetic field that can effectively be used for sensing is limited.

According to an embodiment of the present invention, the dipole axis of the magnetic field source is aligned orthogonal to the plane defined by the longitudinal axis and the transverse axis. Hence, the dipole axis is also orthogonal to a sensing direction of the magnetoresistive element which sensing direction is defined by the longitudinal extension of the layers of the stack in direction of the longitudinal axis. Orthogonal in this context shall include tolerances of +/−20° degrees, i.e. the dipole axis is supposed to be arranged with a range of 70° to 110° degrees with respect to the plane defined by the longitudinal axis and the transverse axis.

In one embodiment of the present invention, the magnetic field source is a permanent magnet of a size comparable to the size of the stack of layers. This includes a width of the permanent magnet along the longitudinal axis comparable to the longitudinal extension of the layers of the stack. In this context, comparability preferably includes a width of the permanent magnet not more than ten times the longitudinal extension of the layers of the stack, and preferably not less than half of the longitudinal extension of the layers of the stack. In a very preferred embodiment, the magnet is of rectangular shape in a plane defined by the longitudinal axis and the vertical axis, and in another very preferred embodiment is of cubic shape in its three dimensions. According to another embodiment of the present invention, the magnetic field source is embodied as electromagnet.

Figure 1:
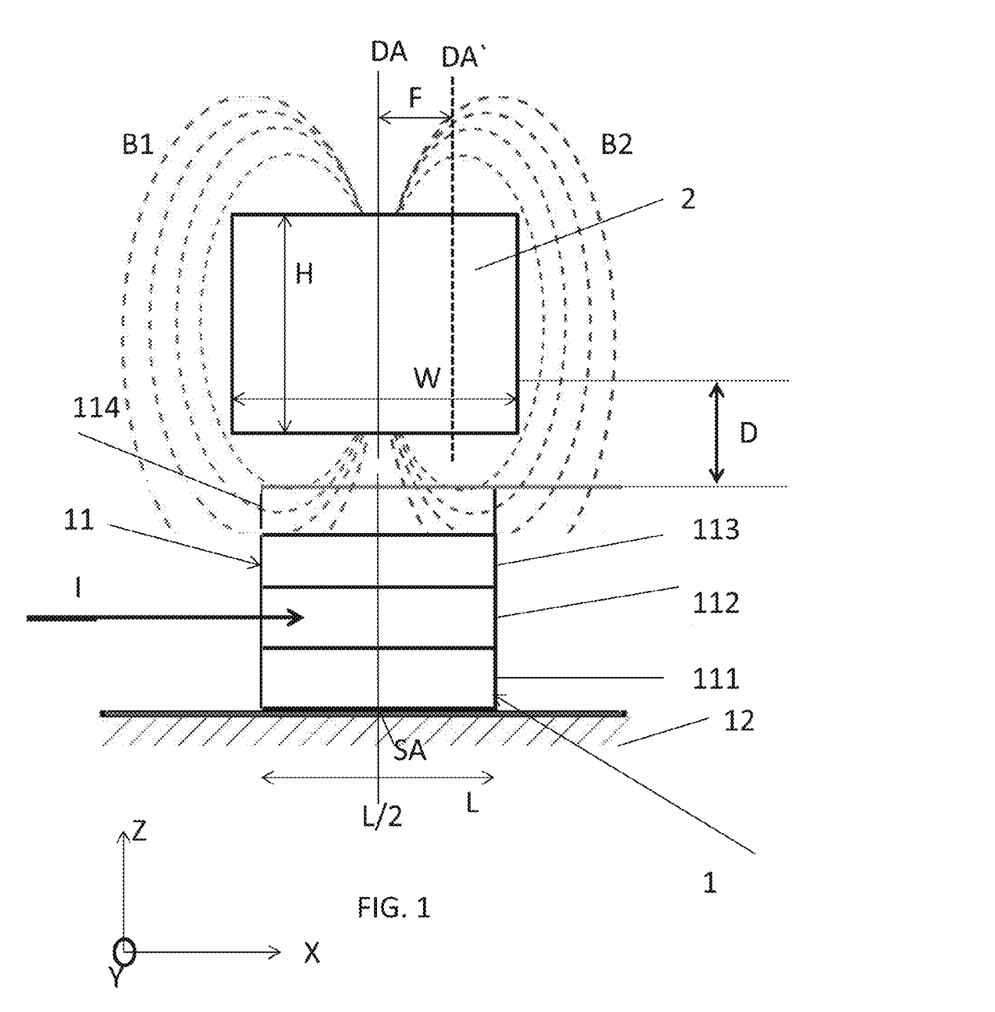
FIG. 1 a schematic cut of a sensor as used in a sensor arrangement according to an embodiment of the present invention.

FIG. 1 illustrates a schematic side cut of sensor arrangement according to an embodiment of the present invention comprising a magnetoresistive element 1 and a magnetic field source 2. The magnetoresistive element 1 is an element specifically underlying the giant magnetoresistivity phenomenon, wherein in thin magnetic multilayers with one or more conductive layers in between spin coupling occurs. The present magnetoresistive element 1 comprises a layer stack 11 arranged on a substrate 12 which layer stack 11 includes at least a first ferromagnetic layer 111, a conductive and non-magnetic layer 112, a second ferromagnetic layer 113, and an antiferromagnetic cover layer 114. Magnetic moments of the ferromagnetic layers 111 and 113 are naturally aligned antiparallel with respect to each other when no external magnetic field is applied. In case an external magnetic field of sufficient strength is applied, magnetic moments become parallel in the ferromagnetic layers 111 and 113, i.e. the magnetization orientations in the ferromagnetic layers 111 and 113 are aligned in parallel. An antiparallel magnetization orientation in the ferromagnetic layers 111 and 113 result in a rather low mean free path of electrons passing the layer stack 11 leading to a rather high electrical resistance in the layer stack 11. On the other hand, a parallel magnetization orientation in the ferromagnetic layers 111 and 113 result in a rather high mean free path of electrons passing the layer stack 11 leading to a rather low electrical resistance in the layer stack 11. This effect is based on the dependence of electron scattering on the spin orientation at the interfaces of the layers 111, 112 and 113.

The layers of the layer stack show a longitudinal extension L along the longitudinal axis X. The layers also extend along the transverse axis Y into the plane of projection. A current I may be applied to the layer stack during position sensing. The layers of the stacks are arranged vertically, i.e. along vertical axis Z on top of each other.

The magnetic field source 2 may in the present embodiment be a permanent magnet, or in another embodiment an electromagnet, and more specifically an electromagnet comprising a coil and a magnetic core, or a solenoid. Preferably, miniature ultra-thin magnetic dipoles may be used for enabling the stack of layers being exposed to magnetic fields with a very high gradient. A position sensing resolution of less than <200 pm over 100 kHz may be achieved. Presently, the magnetic field source 2 is arranged at a distance D from a surface of the magnetoresistive element 1. The magnetic field source 2 presently is of rectangular shape with a width W along the longitudinal axis X, a depth not visible along the transverse axis y, and a height H along the vertical axis Z.

In the present position, a dipole axis DA of the magnetic field source 2 coincides with a sensor central axis SA of the magnetoresistive element 1. This means, the magnetic field source 2 is centered above the magnetoresistive element 1. The magnetic field source 2 provides a magnetic field illustrated in dashed lines which virtually may be separated into a first portion B1 and a second portion B2. As can be derived from FIG. 1, magnetic field lines from both portions B1 and B2 may affect the layer stack and as such impact the magnetization orientation of the ferromagnetic layers 113 and/or 111. Both portions B1 and B2 qualify by a high gradient when meeting the magnetoresistive element 1 which is desired for achieving a high resolution because yet small changes in the position of the corresponding magnetic field source 2 may cause a realignment of the magnetic spin in the ferromagnetic layers 111, 113 which in turn may affect the conductivity of the layer stack.

Hence, while in conventional position sensor arrangements the magnetic field source is aligned with its dipole axis DA in parallel to a sensing direction X of the magnetoresistive element 1 coinciding with the longitudinal extension of the layers, in the present embodiment the magnet field source 2 is aligned with its dipole axis DA orthogonal to the sensing direction X of the magnetoresistive element 1. For this reason, both a high gradient and a low strength of the magnetic field can be achieved at the same time. The low strength of the magnetic field is owed to the fact that the magnetic field lines go through zero magnitude because the magnetic field in the subject portion when projected to the sensing direction changes direction.

In FIG. 1, another scenario is indicated by a dotted dipole axis DA when the magnetic field source 2 is offset from the center axis SA of the magnetoresistive element 1 in direction of the longitudinal axis X by a distance F. This may, for example, be the case when an object the magnetic field source 2 is attached to is moved with respect to the magnetoresistive element 1.

Figure 2:
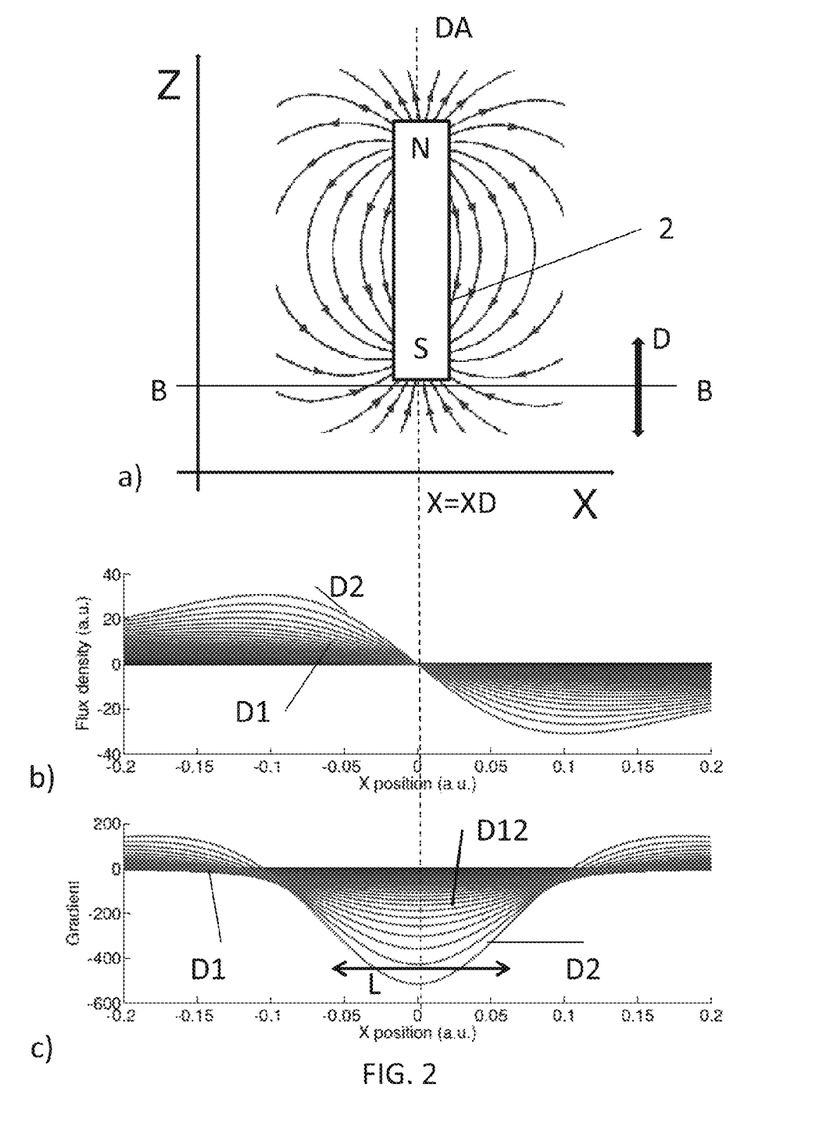
FIG. 2 diagrams illustrating an impact of a magnetic field on a magnetoresistive element according to an embodiment of the present invention.

FIG. 2 shows diagrams illustrating an impact of a magnetic field on a magnetoresistive element according to an embodiment of the present invention. In diagram 2a) the magnetic field lines of a magnetic dipole are shown wherein the longitudinal extension of the magnetoresistive element is indicated by line B-B which magnetoresistive element may be positioned at various distances D from the magnet as is indicated by the double arrow. The magnetic field lines are shown in a plane defined by the longitudinal axis X and the vertical axis Z. In diagram 2b), a corresponding flux density—also denoted as strength of the magnetic field—is shown over the longitudinal axis X, and specifically is shown for different distances D between the magnet and the magnetoresistive element. It can be derived from diagram 2b) that the magnetic flux is zero at the location of the dipole axis X=XD while it is non-zero for X outside XD. In diagram 2c), the corresponding gradient of the magnetic field is shown over the longitudinal axis X, and specifically is shown for different distances D between the magnet and the magnetoresistive element with D1>D2. It can be derived from diagram 2c), that at the location of the dipole axis X=XD, the gradient has a maximum value while outside the dipole axis X=XD the gradient is lower in its absolute value. It further can be derived from diagram 2b) that the bigger the distance D is the lower the magnetic flux density is while the closer the magnetoresistive element is arranged with respect to the magnet the higher the magnetic flux density is. On the other hand, it can be derived from diagram 2c) that the closer the magnetoresistive element gets to the magnet, the higher the maximum gradient value becomes at X=XD.

In terms of resolution a high gradient and a low flux density is desired at the same time. Diagram 2c) in addition shows that a determination of the distance D may preferably also take into account the linearity of the gradient: This sensing range can be impacted by the magnetic field. It may be desired at the same time to provide a position sensor sensing with a rather linear property over the sensing range. However, from diagram 2c) it can be derived that the closer the magnetoresistive element is arranged with respect to the magnet, the higher the maximum gradient becomes, but after a point the gradient becomes less linear across the sensing range. Hence, it may be preferred to select a distance D12 that at the same time provides a sufficient gradient and a sufficient linearity in the sensing range.

Figure 3:
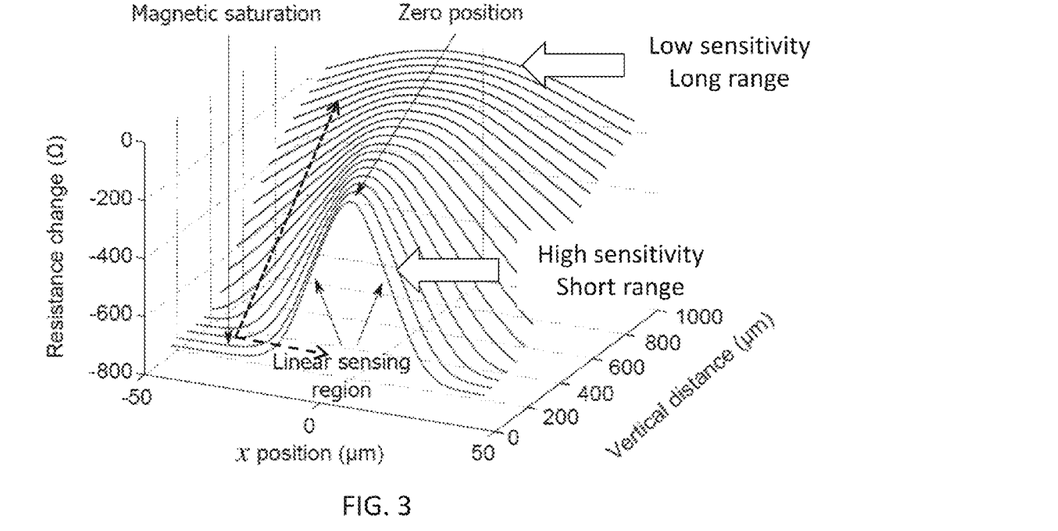
FIG. 3 a diagram illustrating an impact of a magnetic field on a magnetoresistive element according to an embodiment of the present invention.

FIG. 3 depicts a diagram illustrating an impact of a magnetic field on a magnetoresistive element according to an embodiment of the present invention. It is assumed that in the x=0 longitudinal position the magnetic dipole is arranged centered on the magnetoresistive element 1 such as shown in FIG. 1, i.e. the dipole axis DA coincides with the sensor axis SA. As can be derived from FIG. 3, in a region to the left and right of x=0, there is a linear relation between the change in resistance and x. However, at some longitudinal position x magnetic saturation occurs such that the change in resistance is not indicative of the longitudinal position x. However, it is only a rather short sensing range in x, where linearity is given. Generally, the term sensing range is defined as the range in dimension X where no saturation occurs.

On the other hand, the diagram in FIG. 3 shows the effect of varying the vertical distance between the magnetoresistive element and the magnetic dipole: It can be derived that for short vertical distances a high sensitivity/slope can be achieved while for longer vertical distances the sensitivity drops. On the other hand, for longer vertical distances, the sensing range in x broadens, and saturation does not even occur. The magnetic dipole may be positioned relative to the magnetoresistive element at a vertical distance such that a large gradient of the applied magnetic field is achieved in the sensing range while at the same time good linearity properties over the sensing range are provided. Such arrangement may lead to a high bandwidth sensing but on the other hand to a limited sensing range owed to the magnetic saturation.

Based on the insight of the characteristics of such a sensor as illustrated in FIG. 3, it is suggested to adapt operating parameters of the sensor, i.e. parameters for operating the magnetic field source and/or the magnetoresistive element in order to broaden the sensing range without running into saturation.

Under the assumption, that according to FIG. 3 the present operating scenario is in the magnetic saturation, e.g. exactly where the assigned "magnetic saturation" arrow points at, there may be several measures to reconfigure the operation of sensor to a non-saturated region for further operations. In one embodiment, the vertical distance between the magnetic field source and the magnetoresistive element may be adjusted, and in this particular example may be increased according to the dotted arrow. This results in sensing in a non-saturated region however, at a lower sensitivity compared to the previous sensing region when still being in the non-saturated state. In a different embodiment, the same effect can be achieved by adjusting the operating current of an electromagnet in case the magnetic field source is embodied as an electromagnet. In a different approach, which is indicated by a dashed line arrow, the sensing region is adjusted by bringing the dipole axis and the sensor axis closer together again, i.e. by a relative movement of the magnetic dipole and the magnetoresistive element in sensing direction, i.e. in x-direction. For any of the introduced re-adjustments, the output signal of the magnetoresistive element is used in a feedback loop.

Hence, new sensing methods are introduced in which feedback is used to enhance the range of operation and/or position sensitivity of the sensor. In doing so, the specific properties of a magnetoresistive position sensing concept are exploited and materialized in embodiments, such as the possibility of adjusting the magnetic field that affects the sensing element in two different ways at the same time, e.g. by changing the strength of the magnetic field and/or by changing the position of the magnetic field source. This idea allows for the development of a large-range, high-resolution magnetoresistive position sensor arrangement.

Figure 4:
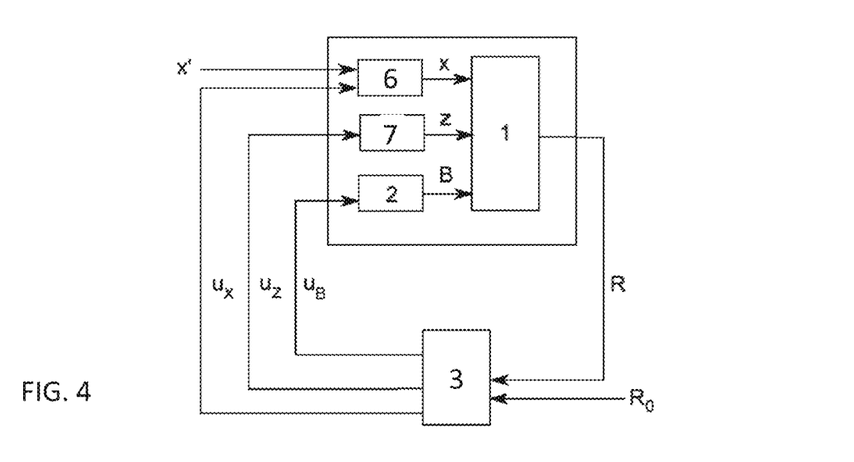
FIG. 4 a block diagram of a sensor arrangement according to an embodiment of the present invention.

FIG. 4 illustrates a block diagram of a sensor arrangement according to an embodiment of the present invention. A magnetic field source 2 acts on a magnetoresistive element 1, for example such as disclosed in any of the previous embodiments. The magnetoresistive element 1 provides an output signal R which presently reflects a resistance of the magnetoresistive element 1. This output signal R depends on the relative position between the magnetoresistive element 1 and the magnetic field source 2 along the longitudinal axis X. The relative position between these elements may be the one an object, that preferably is movable along the longitudinal axis X, to which one of the magnetoresistive element and the magnetic field source is coupled or attached. Any such movement of the object is referred to by x'.

The output signal R of the sensor 1, 2 is supplied to a feedback controller 3 which in addition receives a reference output R0. The feedback controller 3 is configured to control one or more actuators 6, 7, or the magnetic field source 7, such that the output signal R is maintained equal to the reference output R0, which may in one embodiment represent a constant resistance value, to which the output signal R shall be controlled to. In another embodiment, the reference output is variable. For this purpose, it is preferred that a deviation of the output signal R from the reference output R0 is determined by means of subtraction. The deviation may be converted in one or more control signals ux, uz, uB for adjusting the operation and specifically for adjusting the sensing range. uB represents a control signal for adjusting a magnetic flux B of the magnetic field source 2 that meets the magnetoresistive element 1, such as a current to a coil of the magnetic field source 2. ux denotes a control signal for adjusting the relative position x between the magnetoresistive element 1 and the magnetic field source 2 along the longitudinal axis X. This distance may be adjusted by the suitable actuator 6 for longitudinally moving either the magnetoresistive element 1 or the magnetic field source 2 in response to the control signal ux. uz denotes a control signal for adjusting the relative position z between the magnetoresistive element 1 and the magnetic field source 2 along the vertical axis Z. This distance may be adjusted by the suitable actuator 7 for longitudinally moving either the magnetoresistive element 1 or the magnetic field source 2 in response to the control signal uz. In case of a deviation between the output signal R and the reference output R0, the relative position between the magnetoresistive element 1 and the magnetic field source 2 can be adjusted in x and/or in z direction, and/or the strength of the magnetic field as acting on the magnetoresistive element 1 can be adjusted dependent to the determined deviation. It is noted that the deviation may be converted in either the control signals ux, uz, uB or into two or all three of the control signals ux, uz, uB.

Figure 5:
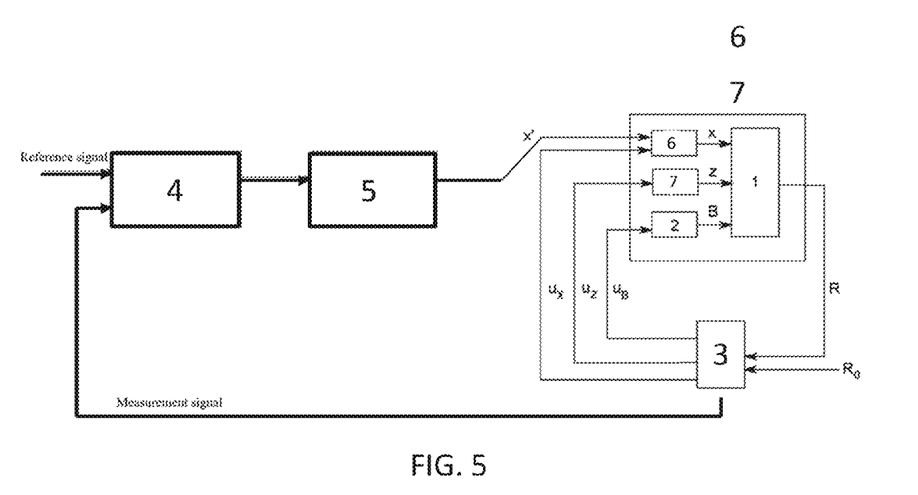
FIG. 5 a block diagram of a device including a sensor arrangement according to another embodiment of the present invention.

FIG. 5 illustrates a diagram of a sensor arrangement according to an embodiment of the present invention. The right hand part reflects the pieces of the sensor arrangement that are also depicted in FIG. 4. x' refers to the position of an object 5, which may be a tool in a plant, or any other object the position of which is desired to be known and/or controlled. Presently, the position of the object 5 is controlled by a controller 4 to meet a reference signal. Therefore, the present position of the object 5, which is represented by the measurement signal supplied by the feedback controller 3 is compared to the reference signal which represents the desired position. The measurement signal preferably is derived from the one or more control signals ux, uz, uB and refers to the present position of the object 5. For example, in case there is no adjustment x of the longitudinal position and no adjustment z of the vertical position for sensitivity purposes, the measurement signal can directly be derived from the magnetic field control signal uB.

Figure 6:
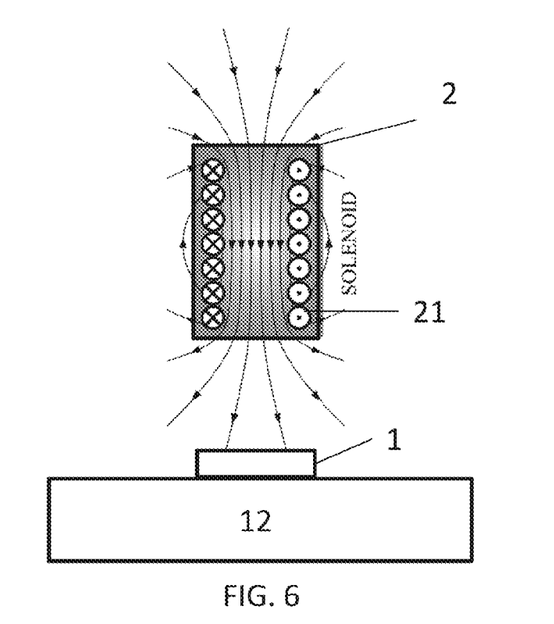
FIG. 6 a cut of a sensor as used in a sensor arrangement according to an embodiment of the present invention representing a first actuation.

FIG. 6 illustrates a cut of a sensor 1, 2 according to an embodiment of the present invention representing a first actuation. The sensor comprises a magnetic field source 2 in form of a solenoid comprising at least one coil 21 for generating a magnetic field as indicated by the arrows. A strength of the magnetic field is dependent on a current I through the coil 21 as is shown by:

$$B_\rho = \frac{\mu_0 I}{2\pi} \frac{1}{L} \sqrt{\frac{\alpha}{\rho}} \left[ \frac{k^2 - 2}{k} K(k^2) + \frac{2}{k} E(k^2) \right]_{s-}^{s+}$$

-continued $$B_{\approx} = \frac{\mu_0 I}{4\pi} \frac{1}{L} \frac{1}{\sqrt{\alpha\rho}} \left[ \varsigma k \left( K(k^2) + \frac{\alpha-\rho}{\alpha+\rho} \prod (h^2, k^2) \right) \right]_{\varsigma^-}^{\varsigma^+}$$

Hence, by modulating the current I through the coil 21, the strength of the magnetic field, and therefore the strength of the magnetic field as it meets a magnetoresistive element 1 which in the present embodiment is arranged on a substrate 12 or other frame of reference, can be modulated precisely and at high speeds. In this embodiment, the relative position between the magnetoresistive element 1 and the magnetic field source 2 is not touched for increasing sensitivity.

Figure 7:
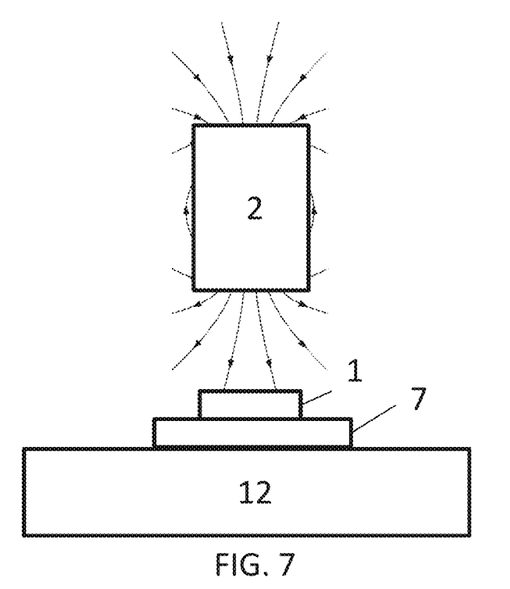
FIG. 7 a cut of a sensor as used in a sensor arrangement according to an embodiment of the present invention representing another actuation.

FIG. 7 illustrates a cut of a sensor 1, 2 according to an embodiment of the present invention representing a different actuation. The sensor comprises a magnetic field source 2, such as a permanent magnet or an electromagnet, for generating a magnetic field as indicated. A strength of the magnetic field as meeting the magnetoresistive element 1 is also dependent on and in particular proportional to a vertical distance z between the magnetoresistive element 1 and the magnetic field source 2 as is approximated for a magnetic dipole as follows:

$$B_x = 3Mxz/r^5$$

$$B_y = 3Myz/r^5$$

$$B_z = M(3z^2 - r^2)/r^5$$

Hence, an actuator 7 is provided, e.g. a piezo-actuator, for adjusting a vertical distance z between the magnetic field source 2 and the magnetoresistive element 1 along the vertical axis Z. By means of controlling the actuator 13 and adjusting the vertical distance, the strength of the magnetic field at the magnetoresistive element 1 can be modulated.

Figure 8:
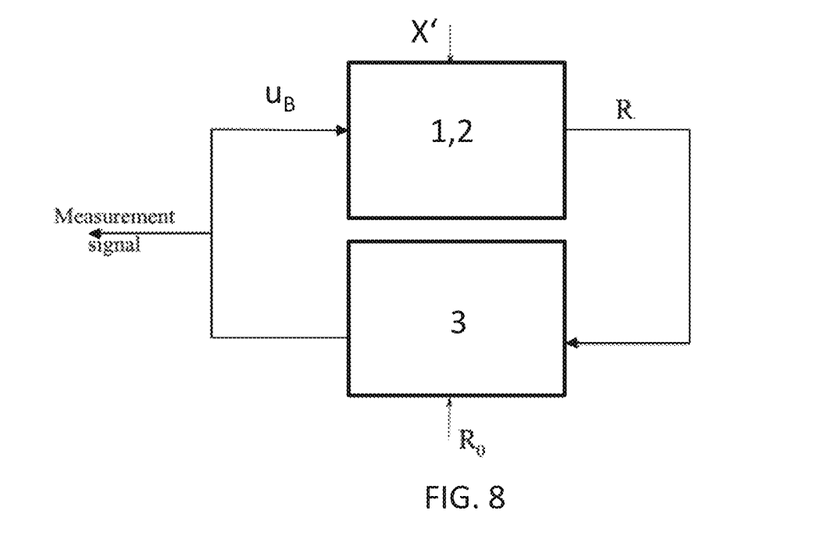
FIG. 8 a block diagram of a sensor arrangement according to an embodiment of the present invention.

FIG. 8 illustrates a block diagram of a sensor arrangement according to an embodiment of the present invention. This sensor arrangement differs from the sensor arrangement of FIG. 4 in that only the strength B of the magnetic field is modified subject to a deviation of the output signal R from the reference output R0. The corresponding adjustment of the strength of the magnetic field again is referred to by uB. Hence, the resistance of the magnetoresistive element 1 is kept constant in the presence of position changes by modulating the strength of the magnetic field. Position changes refer to the relative position between the magnetoresistive element and the magnetic field source in longitudinal direction x' and may be considered—if not induced on purpose—as disturbances which are leveled out by the proposed method. The measurement signal provided in FIG. 8 is derived from the control signal uB converted into a position value. The adjustment of the magnetic field strength can be effected by any one of the concepts addressed in FIGS. 6 and 7.

Figure 9:
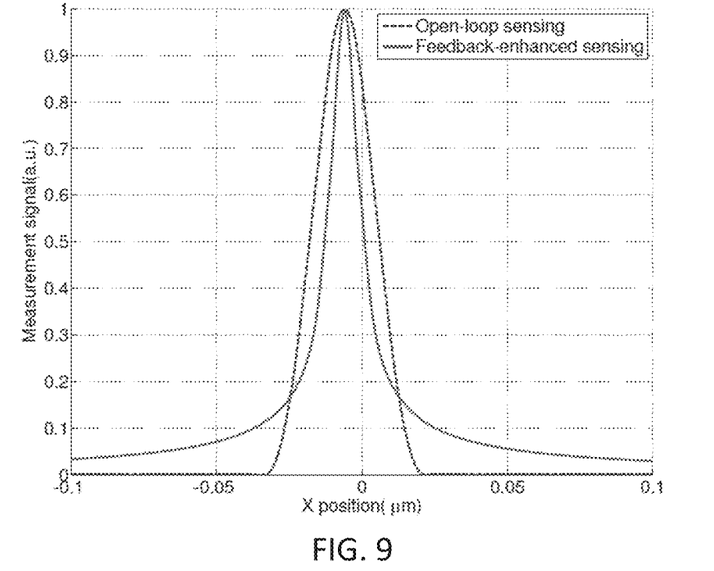
FIG. 9 a corresponding measurement characteristic.

FIG. 9 illustrates a measurement characteristic corresponding to the sensor arrangement of FIG. 8. For an open-loop sensing without the feedback controller 3, the measurement signal over the longitudinal position of the magnetoresistive element 1 is depicted by a dotted line. Instead, the measurement signal over the longitudinal position of the magnetoresistive element 1 for the proposed closed loop control according to FIG. 8 is depicted in a straight line. It can be derived that the open loop sensing enters into magnetic saturation at about x~+/−0.03 μm. As a result, positions x outside ~+/−0.03 μm cannot be sensed, i.e. cannot be discriminated from each other. In contrast, when the sensor 1, 2 is arranged in a closed feedback loop sensor arrangement, there is no saturation owed to the feedback control which persistently moves the operation point of the sensor 1, 2 into a saturated region of sensing.

Figure 10:
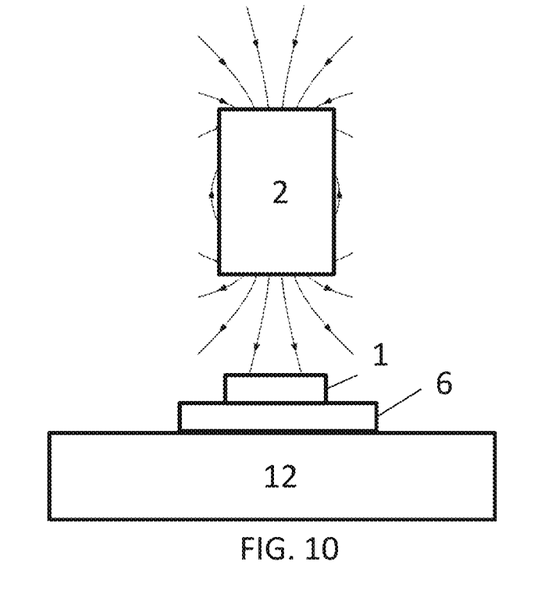
FIG. 10 a cut of a sensor as used in a sensor arrangement according to an embodiment of the present invention representing a further actuation.

FIG. 10 illustrates a cut of a sensor according to an embodiment of the present invention representing a different actuation. The sensor comprises a magnetic field source 2, such as a permanent magnet or an electromagnet, for generating a magnetic field as indicated. Another actuator 6 is provided, e.g. a piezo-actuator, for adjusting the relative position between the magnetic field source 2 and the magnetoresistive element 1 along the longitudinal axis X, and presently acts on the magnetoresistive element 1.

Figure 11:
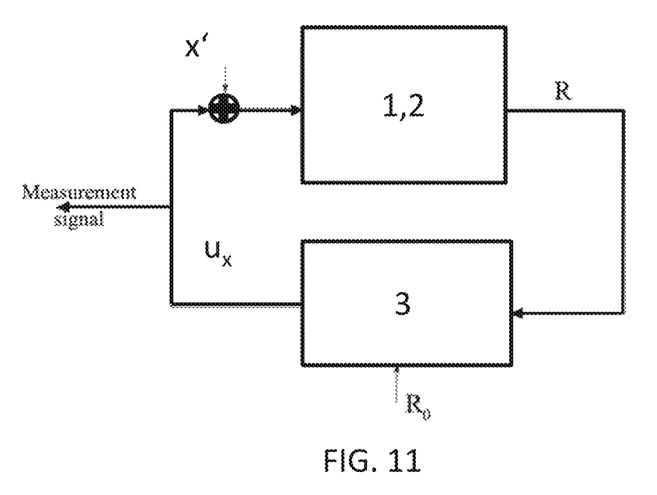
FIG. 11 a block diagram of a sensor arrangement according to another embodiment of the present invention.

FIG. 11 illustrates a block diagram of a sensor arrangement according to another embodiment of the present invention. This sensor arrangement differs from the sensor arrangement of FIG. 4 in that it is only the relative position between the magnetoresistive element 1 and the magnetic field source 2 along the longitudinal axis X that is modified subject to a deviation of the output signal R from the reference output R0. The corresponding control signal for adjusting the position between the magnetoresistive element 1 and the magnetic field source 2 is referred to by ux. Hence, the resistance of the magnetoresistive element 1 is kept constant at the value represented by R0 in the presence of position changes by modulating the longitudinal position x. The measurement signal provided in FIG. 11 is derived from the control signal ux converted into a position value. The adjustment of the longitudinal position can be effected by sensor according to FIG. 10, for example.

Figure 12:
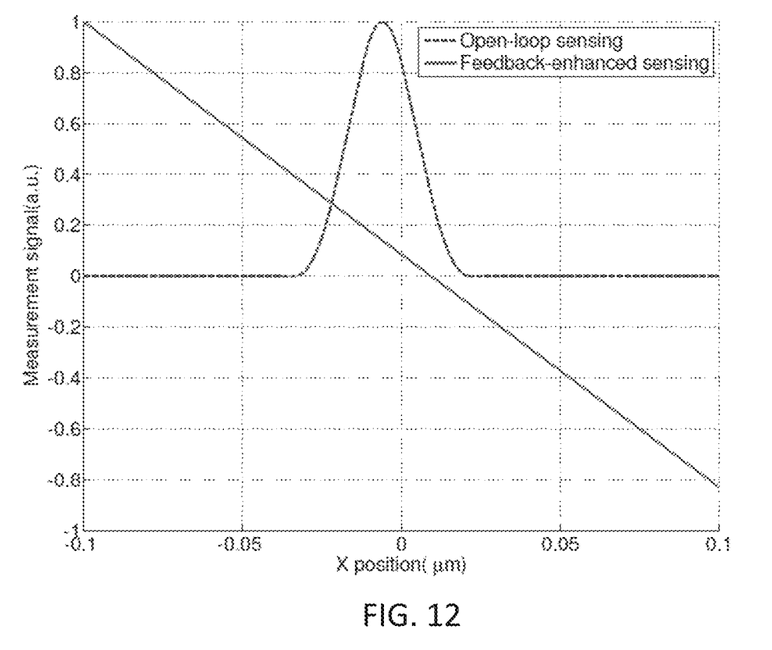
FIG. 12 a corresponding measurement characteristic.

FIG. 12 illustrates a measurement characteristic corresponding to the sensor arrangement of FIG. 11. For an open-loop sensing without the feedback controller 3, the measurement signal over the longitudinal position of the magnetoresistive element 1 is depicted by a dotted line. Instead, the measurement signal over the longitudinal position x of the magnetoresistive element 1 for the proposed closed loop control according to FIG. 11 is depicted in a straight line. It can be seen that the open loop sensing enters into magnetic saturation at about x~+/−0.03 μm. As a result, positions x outside ~+/−0.03 μm cannot be sensed, i.e. cannot be discriminated from each other. In contrast, when the sensor 1, 2 is arranged in a closed feedback loop sensor arrangement, there is no saturation owed to the feedback control applied which persistently moves the operation point of the sensor 1, 2 into a non-saturated and linear region of sensing.

Embodiments of the present invention may be applicable to position sensing in industry, to lithography, and specifically in connection with semiconductors such as the manufacturing, EDA and testing of semiconducting devices, and specifically of micro- and/or nano-electromechanical devices. Any such position sensor may transmit its result wire bound or wireless to an evaluation unit.

What is claimed is:

1. A sensor arrangement for position sensing, comprising
a magnetic field source,
a magnetoresistive element arranged in a magnetic field generated by the magnetic field source and providing an output signal (R) dependent on a position (x) of the magnetoresistive element relative to the magnetic field source, and
a feedback controller configured to receive the output signal (R) of the magnetoresistive element and to adjust a strength of the magnetic field generated by the magnetic field source based on the output signal (R) of the magnetoresistive element.

2. The sensor arrangement of claim 1, wherein one of the magnetoresistive element and the magnetic field source is coupled to an object, wherein the feedback controller is configured to determine a position of the object dependent on one or more of:
an adjustment of the strength of the magnetic field generated by the magnetic field source; and
the output signal (R).

3. The sensor arrangement of claim 2, wherein the magnetoresistive element comprises a stack of layers including at least a conductive layer in between two magnetic layers which layers have a longitudinal extension (L) along a longitudinal axis (X) and a lateral extension along a transverse axis (Y), wherein the magnetic field source has a dipole axis (DA) extending along a vertical axis (Z) orthogonal to a plane defined by the longitudinal axis (X) and the transverse axis (Y), and wherein an electrical resistance of the magnetoresistive element depends on a position of the magnet field source along the longitudinal axis (X).

4. The sensor arrangement of claim 3, wherein the object (5) is movable along the longitudinal axis (X) a position of which object (5) along the longitudinal axis (X) is to be sensed by the sensor arrangement.

5. The sensor arrangement of 4, further comprising an actuator for moving one or more of the magnetic field source and the magnetoresistive element relative to each other along the longitudinal axis (X), wherein the feedback controller is configured to adjust the position (x) of the magnetoresistive element along the longitudinal axis (X) relative to the magnetic field source by controlling the actuator.

6. The sensor arrangement of claim 5, wherein the feedback controller is configured to adjust the position (x) of the magnetoresistive element relative to the magnetic field source dependent on a deviation of the output signal (R) of the magnetoresistive element from a reference output (R0).

7. The sensor arrangement of claim 6, further comprising another actuator for moving one or more of the magnetic field source and the magnetoresistive element along the vertical axis (Z), wherein the feedback controller is configured to adjust a vertical position (z) of the magnetoresistive element along the vertical axis (Z) relative to the magnetic field source by controlling the other actuator, and wherein the feedback controller is configured to adjust the strength of the magnetic field acting on the magnetoresistive element by controlling the other actuator.

8. The sensor arrangement of claim 7, wherein the feedback controller is configured to adjust the strength of the magnetic field acting on the magnetoresistive element dependent on a deviation of the output signal (R) of the magnetoresistive element from a reference output (R0).

9. The sensor arrangement of claim 8, wherein the output signal (R) represents a resistance of the magnetoresistive element, wherein the reference output (R0) represents a constant reference resistance value, and wherein the feedback controller is configured to adapt the one or more of the position of the magnetoresistive element relative to the magnetic field source and the strength of the magnetic field of the magnetic field source to maintain the resistance of the magnetoresistive element equal to the constant reference resistance value.

10. The sensor arrangement of claim 9, wherein the reference output (R0) is selected from a range of output signal values in which the combination of the magnetoresistive element and the magnetic field source are operated in a non-saturated state.

11. The sensor arrangement of claim 10, wherein the magnetic field source is arranged at a distance $D>0$ μm from the magnetoresistive element along the vertical axis (Z).

* * * * *